United States Patent [19]
Danielsons et al.

[11] Patent Number: 6,054,895
[45] Date of Patent: Apr. 25, 2000

[54] APPARATUS AND METHOD FOR PRE-DISTORTION CORRECTION OF A POWER AMPLIFIER STAGE

[75] Inventors: David Christopher Danielsons, Hannibal, Mo.; Bruce Russell Meredith, Menden, Ill.

[73] Assignee: Harris Corporation, Melbourne, Fla.

[21] Appl. No.: 09/107,265

[22] Filed: Jun. 30, 1998

Related U.S. Application Data

[60] Provisional application No. 60/057,096, Aug. 27, 1997.

[51] Int. Cl.$^7$ .............................. H03F 1/26; H03G 3/10; H03G 7/00
[52] U.S. Cl. ............................ 330/149; 330/284; 333/14
[58] Field of Search ..................................... 330/149, 150, 330/124 R, 284; 333/14

[56] References Cited

U.S. PATENT DOCUMENTS

| | | |
|---|---|---|
| 4,291,277 | 9/1981 | Davis et al. . |
| 4,580,111 | 4/1986 | Swanson . |
| 5,132,637 | 7/1992 | Swanson . |
| 5,191,338 | 3/1993 | Katz et al. . |
| 5,528,532 | 6/1996 | Shibutani . |
| 5,789,979 | 8/1998 | Kumar et al. ............................ 330/149 |

FOREIGN PATENT DOCUMENTS

0784379A1   7/1997   European Pat. Off. .

OTHER PUBLICATIONS

M. Bellis, Harris Allied Broadcast: "An Energy Efficient UHF Power Amplifier for Existing and Proposed Transmission Systems" Broadcast Sessions, Montreux, Jun. 10–15, 1993, No. SYMP. 1993, Jun. 10, 1993, pp. 739–747; Figures 1–4.

H. Igarashi M. Niwa H. Ashida: "GaAs Fet Power Amplifier for 6 GHz SSB Radio" IEEE Global Telecommunications Conference, vol. 3/3, Nov. 26–29, 1984, pp. 1246–1252, XP002085728, Atlanta, Georgia *p. 1246–1247; figures 1–5*.

U.S. Patent application 08/885,374, filed Jun. 30, 1997 to Twitchell, et al.

U.S. Patent application 08/885,375, filed Jun. 30, 1997 to Swanson.

*Primary Examiner*—Robert Pascal
*Assistant Examiner*—Patricia T. Nguyen
*Attorney, Agent, or Firm*—Tarolli, Sundheim, Covell, Tummino & Szabo L.L.P.

[57] ABSTRACT

In an amplifier circuit having an amplifier path, a new pre-distortion arrangement is provided. The amplifier circuit includes a signal source, an intermediate amplifier stage, and a power amplifier stage connected sequentially, in series along the amplifier path. The power amplifier stage includes one or more amplifiers operationally connected in parallel, and one or more pre-correction circuits. Each of the amplifiers subjecting an inputted signal to shifts away from their intended values. Each of the pre-correction circuits is associated with one of the amplifiers and connected between an output of the intermediate amplifier stage and the associated amplifier. Each of the pre-correction circuits pre-distorts the signal input to the associated amplifier to compensate for the distortion caused by the associated amplifier. Also, preferably, pre-correction circuits are associated with, and in series with, each of the amplifier stages for pre-distorting the signal input to the associated amplifier stage to compensate for the distortion shifts of the associated amplifier stage.

23 Claims, 3 Drawing Sheets

APPARATUS AND METHOD FOR PRE-DISTORTION CORRECTION OF A POWER AMPLIFIER STAGE

RELATED APPLICATION

This application claims benefit of U.S. Provisional Application No. 60/057,096, filed Aug. 27, 1997.

TECHNICAL FIELD

The present invention relates to communication systems and is particularly directed to a system for compensating distortion caused by amplification within any data system, and specifically a broadcast television transmission system.

BACKGROUND OF THE INVENTION

A broadcast communication system employs a high-power amplifier as part of a signal transmission or transponder section of the system. Unfortunately, the high-power amplifier has distorting characteristics that cause distortion of an information signal that is amplified. The distorting characteristics of the high-power amplifier can impact the instantaneous amplitude and phase of the signal significantly.

Several known techniques are used to "pre-distort" or "pre-correct" an information signal in order to adjust the output of the high-power amplifier to the desired signal characteristics. Examples of such pre-correction techniques include those disclosed by Davis et al. in U.S. Pat. No. 4,291,277 and the co-pending U.S. patent application Ser. No. 08/885,374, filed Jun. 30, 1997, to Twitchell et al.

In one type of broadcast communication system, a plurality of high-power amplifiers are utilized, in parallel, to achieve a desired transmission output level. Examples of such communication systems are shown in U.S. Pat. No. 4,580,111 to Swanson, U.S. Pat. No. 5,132,637 to Swanson, and U.S. patent application Ser. No. 08/885,375 to Swanson, filed Jun. 30, 1997.

SUMMARY OF THE INVENTION

In accordance with one aspect, the present invention provides an improvement in an amplifier circuit that has an amplifier path and includes a signal source, an intermediate amplifier stage, and a power amplifier stage connected sequentially, in series along the amplifier path. The power amplifier stage includes a plurality of amplifiers operationally connected in parallel. The amplifier circuit includes a plurality of correction means. Each of the amplifiers subjects an inputted signal to distortion shifts away from their intended values. Each of the correction means is associated with one of the plurality of amplifiers and is connected between an output of the intermediate amplifier stage and the associated power amplifier. Each of the correction means pre-distorts the signal input to the associated amplifier to compensate for the distortion caused by the associated amplifier.

In accordance with another aspect, the present invention provides an amplifier circuit for amplifying a signal. The amplifier circuit comprises a plurality of amplifier stages in series along an amplifier path. Each of the amplifier stages has an amplifier which subjects an inputted signal to distortion shifts away from their intended values. The amplifier circuit also includes a plurality of pre-corrector means, each of the pre-corrector means is associated with, and is in series with, one of the amplifier stages for pre-distorting the signal input to the associated amplifier stage to compensate for the distortion shifts of the associated amplifier.

In accordance with yet another aspect, the present invention provides a method for providing an amplified, corrected signal from an amplifier circuit. The amplifier circuit has an amplifier path that includes a single source, an intermediate amplifier stage, and a power amplifier stage connected sequentially, in series along the amplifier path. The power amplifier stage includes a plurality of amplifiers operationally connected in parallel, each of the amplifiers subjecting an inputted signal to shifts away from their intended values. A plurality of corrector means is provided. The corrector means are connected within the amplifier circuit to be associated with one of the plurality of amplifiers and to be connected between an output of the intermediate amplifier stage and the associated power amplifier. The signal from the intermediate amplifier is pre-distorted and input to the associated amplifier at each of the correction means to compensate for the distortion caused by the associated amplifier.

In accordance with yet another aspect, the present invention provides a method for providing a corrected, amplified signal. A plurality of amplifier stages is provided in series along an amplifier path. Each of the amplifier stages has an amplifier which subjects an inputted signal to distortion shifts away from their intended values. A plurality of pre-corrector means is provided. Each of the pre-corrector means is associated with, and in series with, one of the amplifier stages. The signal input to the associated amplifier stage is pre-distorted at the pre-corrector means to compensate for the distortion shifts of the associated amplifier.

BRIEF DESCRIPTION OF THE DRAWINGS

The foregoing and other features and advantages of the present invention will become apparent upon a consideration of the following description taken in connection with the accompanying drawings, wherein.

DESCRIPTION OF PREFERRED EMBODIMENTS

Figure 1:
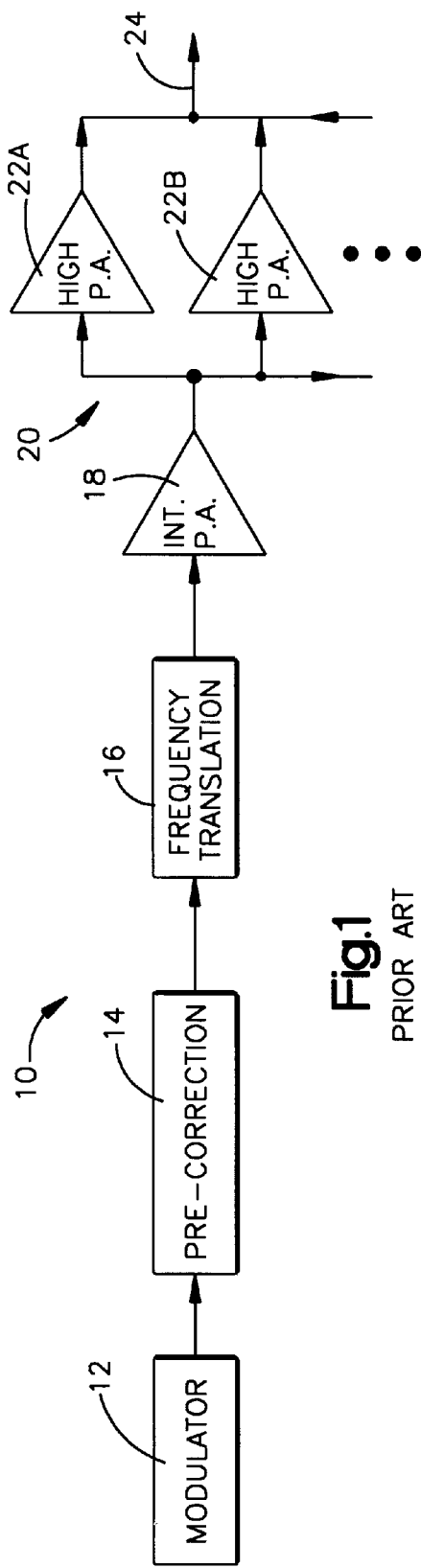
FIG. 1 is a schematic block diagram of a background device.

FIG. 1 illustrates a device 10 for outputting an amplified signal. Typically, the device 10 is part of a broadcast communication system such as a broadcast television system. The device 10 includes a modulation source 12 that outputs an information signal. A pre-correction circuit 2 is operatively connected to the modulation source 12 and receives the information signal from the modulation source. The pre-correction circuit 2 imposes AM to AM and AM to PM conversions on the information signal to compensate for distortions caused within the device 10. It is to be noted that appropriate means for determining compensation amounts are provided in the device 10. The means can include components comprising a feedback path and a comparison arrangement. Such components are known in the art and are not set forth herein for brevity.

A frequency translation circuit 16 is operatively connected to receive the output of the pre-correction circuit 14. The frequency translation circuit 16 is operatively connected to an intermediate power amplifier circuit 18. Thus, the output of the frequency translation circuit 16 provides its output to the intermediate amplifier circuit 18. A first level of amplification is provided to the information signal by the intermediate amplifier circuit 18.

Operatively connected to the output of the intermediate amplifier circuit 18 is a high-power amplifier arrangement 20. The amplifier arrangement 20 includes a plurality of high-power amplifier circuits 22. Any number of high-power amplifier circuits 22 may be provided within the amplifier arrangement 20. In other words, one or more high-power amplifier circuits 22 are provided. In the illustrated device 10, two high-power amplifier circuits 22 are show, and ellipses are shown to represent "N" potential additional high-power amplifier circuits 22. Each high-power amplifier circuit 22 is identified by an alphabetic suffix for ease in referencing.

Within the amplifier arrangement 20, the high-power amplifier circuits 22 are connected in parallel such that the output from the intermediate amplifier circuit 18 is provided to the input of each high-power amplifier circuit 22. Also, the outputs of the high-power amplifier circuits 22 are connected (e.g., summed) to provide an output 24 of the device 10. Although it is not illustrated, it is to be appreciated that suitable switching devices may be employed to selectively connect any combination of the high-power amplifier circuits 22 to receive the output of the intermediate amplifier circuit 18.

Each of the high-power amplifier circuits 22 causes distortion (e.g., linear and non-linear distortion). Particularly, power amplifiers that are of the type used in television and digital television transmissions cause such distortion. Linear and non-linear distortion causes unwanted intermodulation products that result in side band or spectral regrowth. The spectral regrowth limits the maximum power available from an amplifying circuit. In severe cases, it can render an amplifying circuit useless. Spectral regrowth from an amplifying circuit is caused from deviations in the amplifying circuit's ability to reproduce an input signal multiplied by a gain. Such deviations are caused by AM to AM and AM to PM conversion within an amplifying circuit. In addition, linear distortions due to frequency response errors and phase response errors can exist.

When two or more of the high-powered amplifier circuits 22 are combined, the combined distortions (e.g., non-linear) due to each high-power amplifier circuit is an aggregate or sum of the individual amplifier distortions. The pre-correction circuit 14 attempts to compensate for the combination of distortions. The pre-distortion or pre-correction imposed by the pre-correction circuit 14 is an overall improvement for the issues of intermodulation and the spectral regrowth. However, due to linear distortions in each high-power amplifier circuit 22, the overall improvement in intermodulation products of the combined amplifiers is severely limited or even worsened. This is due to the phase difference in each high-power amplifier circuit 22. Specifically, the phase differences results in mismatching. When multiple amplifier circuits 22 are combined in parallel, as is shown by the typical arrangement of FIG. 1, the linear distortions interact with the non-linear distortions and can make the correction imposed by the pre-correction circuit 14 ineffective.

Figure 2:
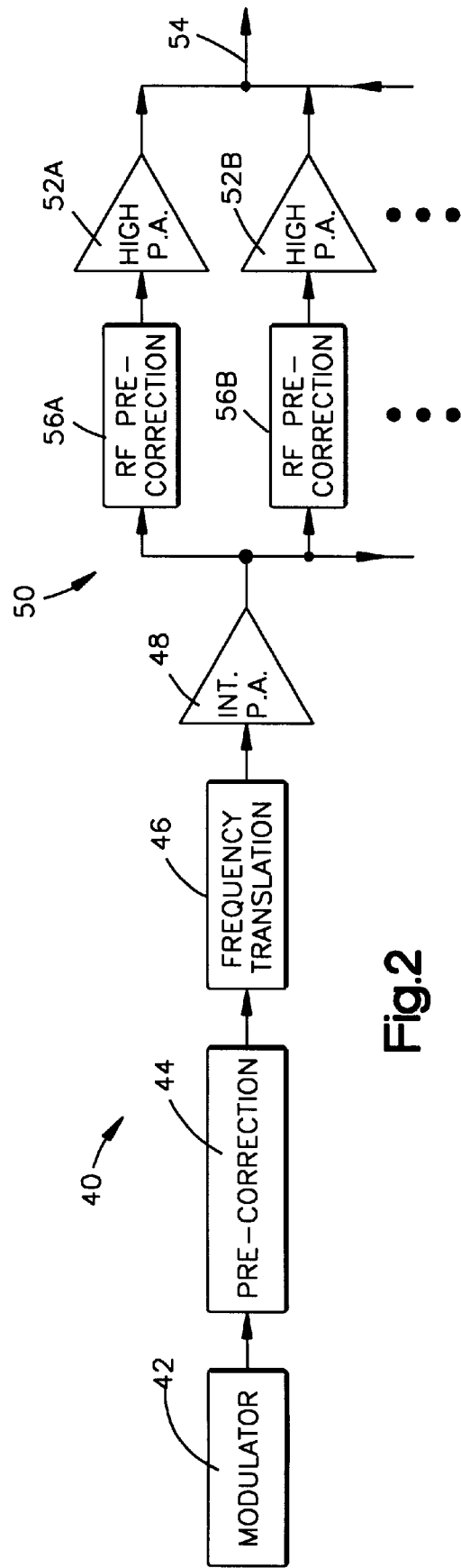
FIG. 2 is a schematic block diagram of a device in accordance with the present invention.

FIG. 2 illustrates a device 40 for compensating (e.g., pre-correcting) for the linear and non-linear distortions such that overall system spectral regrowth and performance is improved compared to typical conventional methods. Specifically, the device 40 includes a modulation source 42, a pre-correction circuit 44, a frequency translation circuit 46, and an intermediate power amplifier circuit 48. These components may have a construction similar to the components 12–18 of the device 10 of FIG. 1. The function of these components 42–48 is similar to the function of the components 12–18 of the device 10 of FIG. 1. However, in the preferred embodiment, the pre-correction provided by the pre-correction circuit 44 is for distortion caused by the intermediate amplifier circuit 48 and is for distortion caused by a high-power amplifier circuit. Such pre-correction for high-power amplification is provided by other means in accordance with the present invention and described below.

Specifically, the device 40 of FIG. 2 differs from the device 10 of FIG. 1 in that the output of the intermediate amplifier circuit 48 (FIG. 2) is provided to a RF correction and high-power amplification circuit arrangement 50. Specifically, the circuit arrangement 50 includes one or more high-power amplifier circuits 52. Preferably, the circuit arrangement 50 has a plurality of high-power amplifier circuits 52 (two are shown, "N" possible additional amplifier circuits are represented by ellipses). Any number of high-power amplifier circuits 52 may be employed. The high-power amplifier circuits 52 are identified by alphabetic suffixes for convenience. The high-powered amplifier circuits 52 are arranged in parallel such that their outputs are combined to provide an output 54 from the device 40.

In accordance with the present invention, the circuit arrangement 50 includes one or more RF pre-correction circuits 56. Preferably, the number of RF pre-correction circuits 56 is identical to the number of high-powered amplifier circuits 52 (i.e., a one-to-one correspondence exists).

Each RF pre-correction circuit 56 that is present is associated with a respective one of the high-powered amplifier circuits 52. Each associated RF pre-correction circuit 56 is operatively connected between the intermediate amplifier circuit 48 and the respective high-powered amplifier circuit 52. Further, the RF pre-correction circuits 56 are arranged in series with its associated high-power amplifier circuit 52 and the plurality of RF pre-correction circuits 56 are arranged in parallel with respect to each other. Thus, the output of the intermediate amplifier circuit 48 is supplied as the input to each of the RF pre-correction circuits 56. It is to be appreciated that, although it is not shown, suitable switches may be employed to connect any combination of the RF pre-correction circuit/high-powered amplifier circuit pairs.

Each RF pre-correction circuit 56 is set or adjusted to compensate for distortion caused by its associated high-powered amplifier circuit 52. Thus, the RF pre-correction circuit 56A is set/adjusted for distortion caused by the high-powered amplifier circuit 52A. The result of such an arrangement is a uniformity among the plurality of high-powered amplifier circuits and lower intermodulation products result at the output 54.

Figure 3:
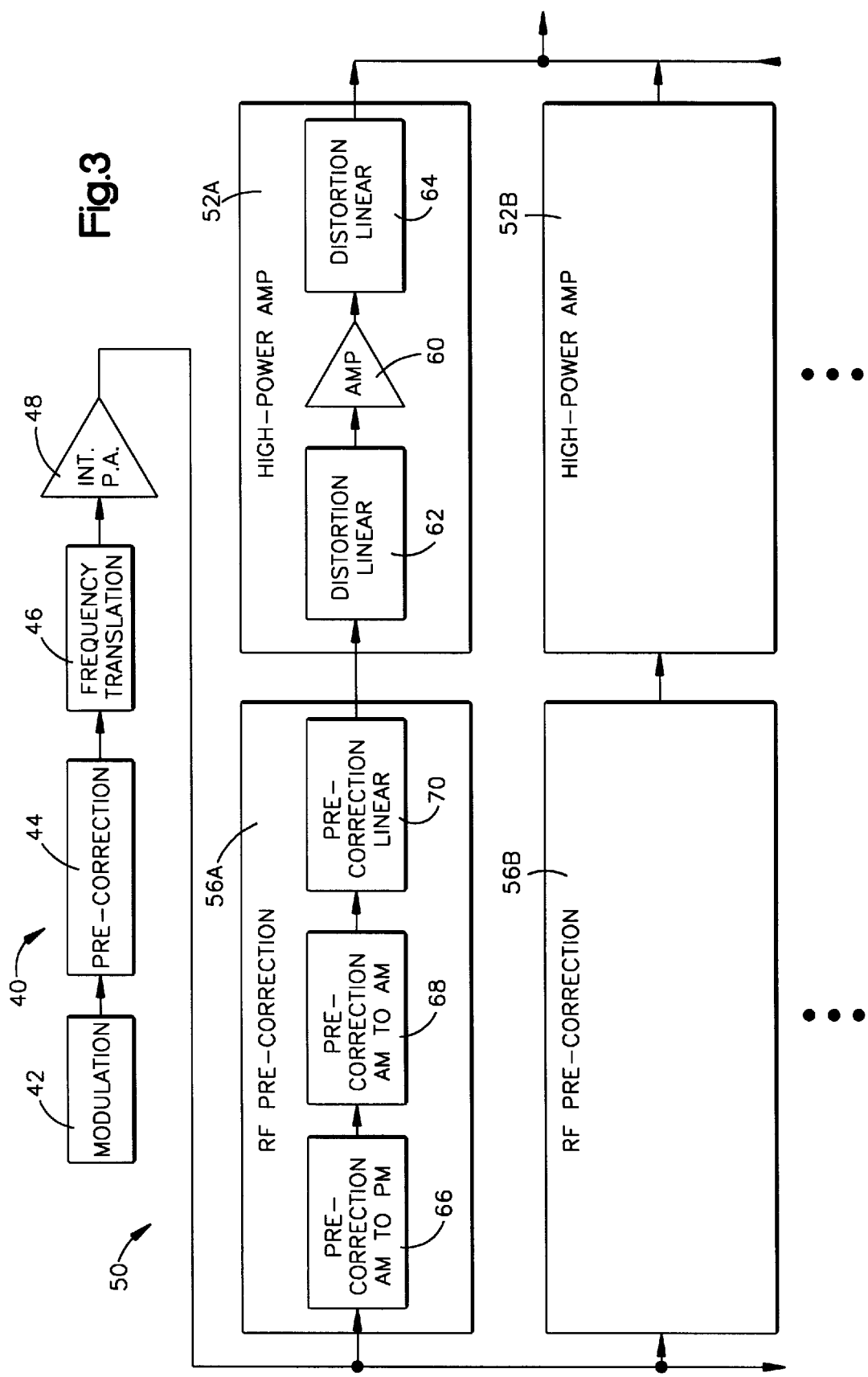
FIG. 3 is a schematic illustration of the device shown in FIG. 2 and shows greater details.

An example of components of the high-power amplifier circuits 52 that are associated with distortion are shown in FIG. 3. Such distortion causing components are in addition to the actual amplifying device 60. Specifically, each high-power amplifier circuit 52 includes linear distortion causing component(s) 62. Typically, the components 62 include input matching components/circuits. Typically, the matching components/circuits consist of a matching network for a solid state device or input cavities for a tube type device. The linear distortion caused by the components 62 include frequency response errors and phase errors from an ideal amplifier straight-line transfer characteristic.

The actual amplifying device 60 has a non-linear distortion effect. This is true whether the amplifying device 60 is solid state type or tube type. The non-linear distortion is due to its mode of operation (i.e., Class A, A/B, etc.) and its saturation characteristics.

Post-amplification components 64 of the high-power amplifier circuit 52 also cause linear distortion. The components 64 comprise the high-power amplifier circuitry output network.

Turning now to the RF pre-correction circuit 56, each circuit 56 consists of a non-linear AM to PM pre-correction circuit 66, a non-linear AM to AM pre-correction circuit 68 and a linear pre-correction circuit 70. The linear pre-correction circuit 70 functions to precisely pre-correct the linear distortion caused by the components 62 and 64 of the high-power amplifier circuit 52. The pre-correction circuits 66 and 68 precisely compensate for the non-linear distortion caused by the amplifying device 60. A significant result of such a circuit arrangement is that the cascade of circuits closely resembles an ideal amplifying device without distortion. Further, when a plurality of ideal amplifying devices are combined in parallel, the result will be combined amplification that resembles ideal amplification.

Figure 4:
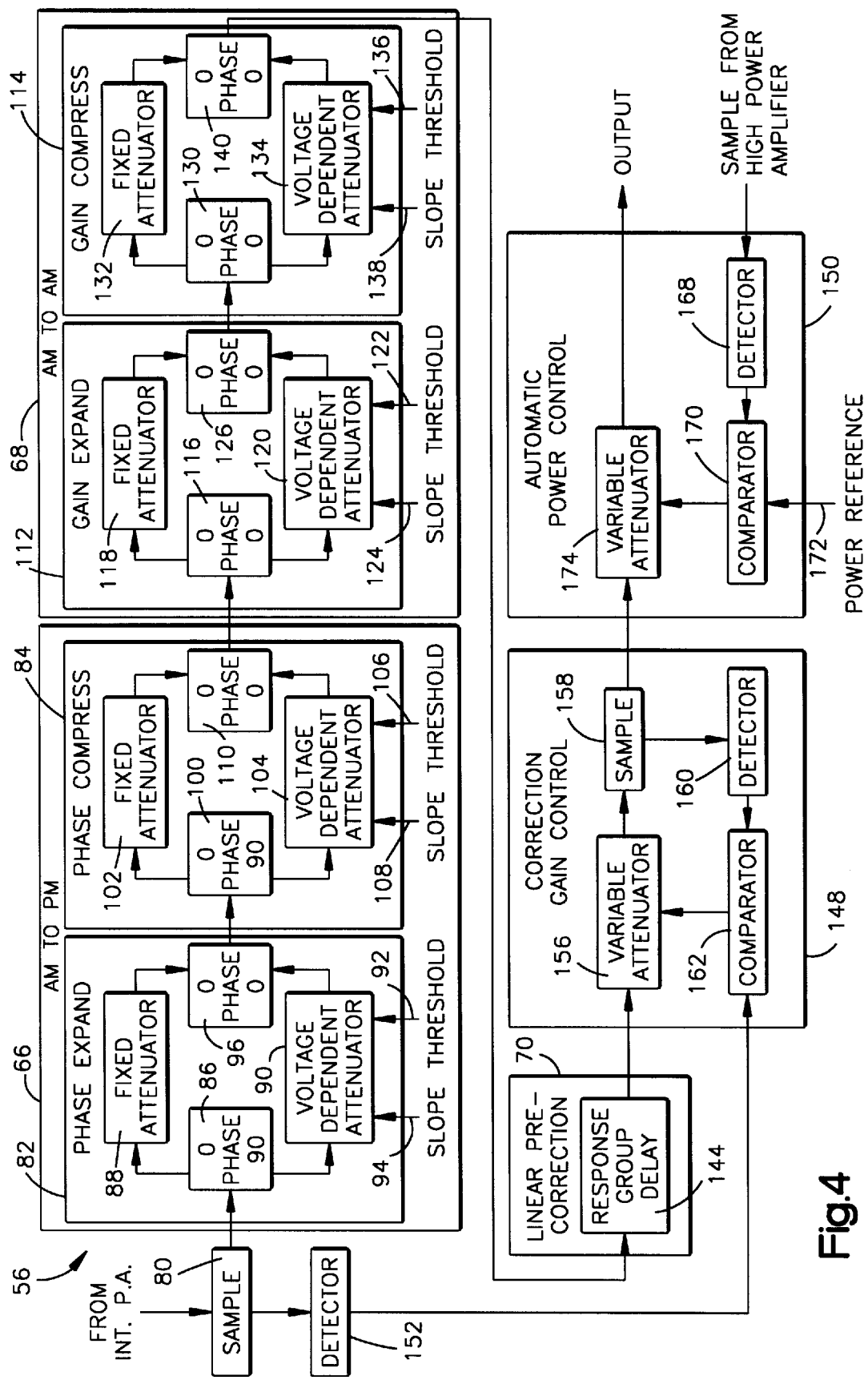
FIG. 4 is a schematic block diagram of a portion of the apparatus of FIG. 2.

FIG. 4 illustrates one preferred embodiment of components for the RF pre-correction circuit 56. The input from the intermediate amplifier circuit 48 is provided to the AM to PM pre-correction circuit 66 through a sample device 80. The AM to PM pre-correction circuit 66 consists of a quadrature type circuit. Specifically, the AM to PM pre-correction circuit 66 includes phase expansion circuitry 82 and phase compression circuitry 84.

The phase expansion circuitry 82 includes a phase circuit 86 that receives the information signal (i.e., the output of the intermediate amplifier circuit 48) and provides two outputs, each having a different phase. The first output has a zero-degree phase and the second output has a 90-degree phase. The zero-degree phase output is provided to a fixed RF attenuator circuit 88.

The 90-degree phase output from the phase circuit 86 (i.e., the second output), is provided to a variable RF attenuator circuit 90. Preferably, the variable attenuator circuit 90 is a voltage controlled (i.e., voltage-dependent). The voltage-dependent attenuator circuit 90 removes attenuation only when the RF level reaches a specific voltage level. The specified voltage level is determined by a threshold input 92 to the voltage-dependent attenuator circuit 90. In addition, the voltage-dependent attenuator circuit 90 removes a specific amount of attenuation dependent upon a slope input 94.

The output of the fixed attenuator circuit 88 and the output of the voltage-dependent attenuator circuit 90 are combined at circuitry 96. The combined signal output from circuitry 96 is a signal that has its phase transfer function modified dependent upon the settings of the threshold input 92 and the slope input 94. In one preferred embodiment, the slope and threshold settings are set/adjusted by an operator.

The output of the phase expansion circuitry 82 is input to the phase compression circuitry 84. Specifically, the output signal from circuitry 96 is provided to a phase circuit 100. The phase circuit 100 has a first output with a zero-degree phase and a second output with a 90-degree phase. The zero-degree phase output (the first output) from the phase circuit 100 is provided to a fixed RF attenuator circuit 102.

The 90-degree phase output (the second output) from the phase circuit 100 is provided to a variable RF attenuator circuit 104. Preferably, the variable attenuator circuit 104 is voltage controlled (i.e., voltage-dependent). The voltage-dependent attenuator circuit 104 applies attenuation only when the RF level reaches a specific voltage level, as determined by a threshold input 106. Further, the voltage-dependent attenuator circuit 104 applies a specific amount of attenuation in response to a slope input 108. In one preferred embodiment, the threshold and slope inputs 106 and 108 are set/adjusted by an operator.

The output of the fixed attenuator circuit 102 and the output of the voltage-dependent attenuator circuit 104 are combined at circuitry 110. A resulting output from the circuitry 110 is the output of the AM to PM pre-correction circuit 66 and is dependent upon the threshold and slope inputs 106 and 108.

The output from the AM to PM pre-correction circuit 66 is provided to the AM to AM pre-correction circuit 68. Within the AM to AM pre-correction circuit 68 gain expansion circuitry 112 and gain compression circuitry 114 are provided. The gain expansion circuitry 112 receives the signal output by the AM to PM pre-correction circuit 66.

Within the gain expanding circuitry 112, is circuitry 116 for creating two output paths. The first output path has a zero-degree of phase difference and is provided to a fixed RF attenuator circuit 118. The second path has a zero-degree phase difference, and is provided to a variable RF attenuator circuit 120. Preferably, the variable attenuator circuit 120 is voltage dependent. The voltage-dependent attenuator circuit 120 processes the provided signal such that attenuation is removed only when the RF level reaches a specified voltage level. The specified voltage level is determined by a threshold input 122. In addition, the voltage-dependent attenuator circuit 120 removes a specific amount of attenuation based upon a slope input 124. The threshold and slope inputs 122 and 124 are set/adjusted by an operator in one preferred embodiment.

The output of the fixed attenuator circuit 118 and the output of the voltage-dependent attenuator circuit 120 are combined at circuitry 126. A resulting output from the circuitry 126 is the output of the gain expansion circuitry 112 and is dependent upon the threshold and slope inputs 122 and 124.

The gain compression circuitry 114 has circuitry 130 for providing two output signals. The first signal has a zero-degree phase difference and is provided to a fixed RF attenuator circuit 132. The second signal has a zero-degree phase difference, and is provided to a variable RF attenuator circuit 134. The variable attenuator circuit 134 is voltage dependent in one preferred embodiment.

The voltage-dependent attenuator circuit 134 applies attenuation only when the RF level reaches a specified voltage level. The specified voltage level is determined by a threshold input 136. Also, the voltage-dependent attenuator circuit 134 applies a specific amount of attenuation dependent upon a slope input 138. In one preferred embodiment, the threshold and slope inputs 136 and 138 are set/adjusted by an operator.

The output of the fixed attenuator circuit 132 and the output of the voltage-dependent attenuator circuit 134 are combined at circuitry 140. A resulting output from the circuitry 140 is the output of the AM to AM pre-correction circuit 68 and is dependent upon the threshold and slope inputs 136 and 138.

The linear pre-correction circuit 70 includes a group response delay 144. Accordingly, the linear pre-correction circuit 70 corrects for frequency response errors and phase response errors that cause linear distortion.

As a further system enhancement, the RF pre-correction circuit 56 can include correction gain control circuitry 148 and automatic power control circuitry 150. These circuits are shown in FIG. 4.

In order for the correction gain control circuitry 148 to function, the sample device 80 samples the incoming signal from the intermediate amplifier circuit 48 to create an input reference. The sample reference is detected at detection circuitry 152. The output of the detection circuitry 152 is provided to the correction gain control circuitry 148.

Within the correction gain control circuitry 148 is a loop that comprises a variable attenuator circuit 156, sample device 158, detection circuitry 160, and comparator circuitry 162. A first input to the variable attenuator circuit 156 is the output from the linear pre-correction circuit 70. The sample device samples the output of the variable attenuator circuit 156 and the sampling is detected by the detection circuitry 160.

The output of the detection circuitry 160 is provided to the comparator circuitry 162. The output of the detection circuitry 152 is also provided to the comparator circuitry 162. The comparator circuitry 162 compares the detected incoming signal (i.e., an input reference) to the detected output signal from the linear pre-correction circuit 70, via the variable attenuator circuit 156 (i.e., an output reference). The output of the comparator circuitry 162 is used to control the variable attenuator circuit 156. Specifically, the difference between the input reference and the output reference is an error voltage that controls the variable attenuator circuit 156 in such a way to keep the overall gain of the signal through the RF pre-correction circuitry 56 at a constant level.

Turning now to the other mentioned enhancement, the automatic power control circuitry 150 utilizes a sample from the output signal of the high-power amplifier circuit 52 to control an output power level. Specifically, the automatic power control circuitry includes detector circuitry 168 that detects a sampled signal from the output of the high-power amplifier circuit 52. The output from the detector circuitry 168 is provided to comparator circuitry 170. A second input to the comparator circuitry 170 is provided via a power reference 172. An output of the comparator circuitry 170 is an error signal and is used to a control variable attenuator circuit 174.

The signal that is input to the automatic power control circuitry 150 (i.e., the output of the correction gain control circuitry 148, if present) is variably attenuated dependent upon the signal output from the comparator circuitry 170. The attenuation provided within the automatic power control circuitry 150 is such that the output level is held at a constant power level. Holding the output of the high-power amplifier circuits 52 at constant level reduces combining losses of multiple amplifiers.

It is to be noted that the various components of the disclosed embodiment of the present invention may have various circuitry arrangements. Each of the disclosed components, by itself, may have any known circuitry arrangement. Such known circuitry arrangements are not disclosed herein for brevity.

From the above description of the invention, those skilled in the art will perceive improvements, changes and modifications. Such improvements, changes and modifications within the skill of the art are intended to be covered by the appended claims.

Having described the invention, the following is claimed:

1. In an amplifier circuit having an amplifier path and including a signal source, an intermediate amplifier stage, and a power amplifier stage connected sequentially, in series along said amplifier path, wherein said power amplifier stage includes a plurality of amplifiers operationally connected in parallel, and a plurality of correction means, each of said amplifiers subjecting an inputted signal to distortion shifts away from their intended values, each of said correction means being associated with one of said plurality of amplifiers and connected between an output of said intermediate amplifier stage and said associated amplifier, and each of said correction means for pre-distorting the signal input to said associated amplifier to compensate for the distortion caused by said associated amplifier, wherein each of said correction means includes means for compensating for phase and amplitude distortion caused by said associated amplifier.

2. In an amplifier circuit having an amplifier path and including a signal source, an intermediate amplifier stage, and a power amplifier stage connected sequentially, in series along said amplifier path, wherein said power amplifier stage includes a plurality of amplifiers operationally connected in parallel, and a plurality of correction means, each of said amplifiers subjecting an inputted signal to distortion shifts away from their intended values, each of said correction means being associated with one of said plurality of amplifiers and connected between an output of said intermediate amplifier stage and said associated amplifier, and each of said correction means for pre-distorting the signal input to said associated amplifier to compensate for the distortion caused by said associated amplifier, wherein each of said correction means includes means for compensating for linear and non-linear distortion caused by said associated amplifier.

3. An amplifier circuit as set forth in claim 2, wherein said intermediate amplifier stage includes an amplifier that subjects an inputted signal to distortion shifts away from its intended values, said amplifier circuit includes correction means associated with said amplifier of said intermediate amplifier stage for pre-distorting the signal input to said associated amplifier of said intermediate amplifier stage to compensate for the distortion caused by said associated amplifier of said intermediate amplifier stage.

4. In an amplifier circuit having an amplifier path and including a signal source, an intermediate amplifier stage, and a power amplifier stage connected sequentially, in series along said amplifier path, wherein said power amplifier stage includes a plurality of amplifiers operationally connected in parallel, and a plurality of correction means, each of said amplifiers subjecting an inputted signal to distortion shifts away from their intended values, each of said correction means being associated with one of said plurality of amplifiers and connected between an output of said intermediate amplifier stage and said associated amplifier, and each of said correction means for pre-distorting the signal input to said associated amplifier to compensate for the distortion caused by said associated amplifier, wherein each of said correction means is controlled by an external input.

5. In an amplifier circuit having an amplifier path and including a signal source, an intermediate amplifier stage, and a power amplifier stage connected sequentially, in series along said amplifier path, wherein said power amplifier stage includes a plurality of amplifiers operationally connected in parallel, and a plurality of correction means, each of said amplifiers subjecting an inputted signal to distortion shifts away from their intended values, each of said correction means being associated with one of said plurality of amplifiers and connected between an output of said intermediate amplifier stage and said associated amplifier, and each of said correction means for pre-distorting the signal input to said associated amplifier to compensate for the distortion caused by said associated amplifier, wherein each of said correction means includes gain expansion/compression means for correcting AM to AM distortion caused by said associated amplifier, and phase expansion/compression means for correcting AM to PM distortion caused by said associated amplifier.

6. In an amplifier circuit having an amplifier path and including a signal source, an intermediate amplifier stage, and a power amplifier stage connected sequentially, in series along said amplifier path, wherein said power amplifier stage includes a plurality of amplifiers operationally connected in parallel, and a plurality of correction means, each of said amplifiers subjecting an inputted signal to distortion shifts away from their intended values, each of said correction means being associated with one of said plurality of amplifiers and connected between an output of said intermediate amplifier stage and said associated amplifier, and each of said correction means for pre-distorting the signal input to said associated amplifier to compensate for the distortion caused by said associated amplifier, wherein each of said correction means is adjustable, said correction means includes correction gain control means for maintaining signal amplitude constant as said correction means is adjusted.

7. An amplifier circuit as set forth in claim 6, wherein said correction gain control means includes means for deriving a sample of a signal input to said correction means, means for deriving a sample of an output of said correction control means, means for comparing the two samples, and means for attenuating signal amplitude.

8. In an amplifier circuit having an amplifier path and including a signal source, an intermediate amplifier stage, and a power amplifier stage connected sequentially, in series along said amplifier path, wherein said power amplifier stage includes a plurality of amplifiers operationally connected in parallel, and a plurality of correction means, each of said amplifiers subjecting an inputted signal to distortion shifts away from their intended values, each of said correction means being associated with one of said plurality of amplifiers and connected between an output of said intermediate amplifier stage and said associated amplifier, and each of said correction means for pre-distorting the signal input to said associated amplifier to compensate for the distortion caused by said associated amplifier, wherein said correction means including automatic power control for maintaining the output level of said associated amplifier at a constant output level.

9. In an amplifier circuit having an amplifier path and including a signal source, an intermediate amplifier stage, and a power amplifier stage connected sequentially, in series along said amplifier path, wherein said power amplifier stage includes a plurality of amplifiers operationally connected in parallel, and a plurality of correction means, each of said amplifiers subjecting an inputted signal to distortion shifts away from their intended values, each of said correction means being associated with one of said plurality of amplifiers and connected between an output of said intermediate amplifier stage and said associated amplifier, and each of said correction means for pre-distorting the signal input to said associated amplifier to compensate for the distortion caused by said associated amplifier, wherein each of said correction means includes gain modifying means for modifying gain and phase modifying means for modifying phase.

10. An amplifier circuit as set forth in claim 9, wherein said gain modifying means includes means for splitting an inputted signal into two components, fixed attenuator means for operating upon a first one of said components, voltage-dependant attenuator means for operating upon the second one of said components, and means for combining the two operated-upon components.

11. An amplifier circuit as set forth in claim 9, wherein said phase modifying means includes means for splitting an inputted signal into two components which are 90 degrees out of phase, fixed attenuator means for operating upon a first one of said components, voltage-dependant attenuator means for operating upon the second one of said components, and means for combining the two operated-upon components.

12. An amplifier circuit as set forth in claim 9, wherein said amplifier circuit is part of a broadcast signal system.

13. An amplifier circuit for amplifying a signal, said amplifier circuit comprising:

a plurality of amplifier stages in series along an amplifier path, each of said amplifier stages having an amplifier which subjects an inputted signal to distortion shifts away from their intended values; and a plurality of pre-corrector means, each of said pre-corrector means being associated with, and in series with, one of said amplifier stages and for pre-distorting the signal input to said associated amplifier stage to compensate for the distortion shifts of the associated amplifier, wherein at least one of said pre-corrector means includes means for compensating for phase and amplitude distortion caused by said associated amplifier stage.

14. An amplifier circuit for amplifying a signal, said amplifier circuit comprising:

a plurality of amplifier stages in series along an amplifier path, each of said amplifier stages having an amplifier which subjects an inputted signal to distortion shifts away from their intended values; and a plurality of pre-corrector means, each of said pre-corrector means being associated with, and in series with, one of said amplifier stages and for pre-distorting the signal input to said associated amplifier stage to compensate for the distortion shifts of the associated amplifier, wherein at least one of said pre-corrector means includes means for compensating for linear and non-linear distortion caused by said associated amplifier stage.

15. An amplifier circuit for amplifying a signal, said amplifier circuit comprising:

a plurality of amplifier stages in series along an amplifier path, each of said amplifier stages having an amplifier which subjects an inputted signal to distortion shifts away from their intended values; and a plurality of pre-corrector means, each of said pre-corrector means being associated with, and in series with, one of said amplifier stages and for pre-distorting the signal input to said associated amplifier stage to compensate for the distortion shifts of the associated amplifier, wherein at least one of said pre-corrector means is adjustable, said pre-corrector means including correction gain control means for maintaining signal amplitude constant as said pre-corrector means is adjusted.

16. An amplifier circuit as set forth in claim 15, wherein said correction gain control means includes means for coupling-off a sample of a signal input to said pre-corrector means, means for coupling-off a sample of an output of said correction gain control means, means for comparing the two samples, and means for attenuating signal amplitude in response to said comparison.

17. An amplifier circuit for amplifying a signal, said amplifier circuit comprising:

a plurality of amplifier stages in series along an amplifier path, each of said amplifier stages having an amplifier which subjects an inputted signal to distortion shifts away from their intended values; and a plurality of pre-corrector means, each of said pre-corrector means being associated with, and in series with, one of said amplifier stages and for pre-distorting the signal input to said associated amplifier stage to compensate for the distortion shifts of the associated amplifier, wherein said pre-corrector means including automatic power control for maintaining the output level of said associated amplifier at a constant output level.

18. An amplifier circuit for amplifying a signal, said amplifier circuit comprising:

a plurality of amplifier stages in series along an amplifier path, each of said amplifier stages having an amplifier which subjects an inputted signal to distortion shifts away from their intended values; and a plurality of pre-corrector means, each of said pre-corrector means being associated with, and in series with, one of said amplifier stages and for pre-distorting the signal input to said associated amplifier stage to compensate for the distortion shifts of the associated amplifier, wherein each of said pre-corrector means includes gain modifying means for modifying gain and phase modifying means for modifying phase.

19. An amplifier circuit for amplifying a signal, said amplifier circuit comprising:

a plurality of amplifier stages in series along an amplifier path, each of said amplifier stages having an amplifier which subjects an inputted signal to distortion shifts away from their intended values; and a plurality of pre-corrector means, each of said pre-corrector means being associated with, and in series with, one of said amplifier stages and for pre-distorting the signal input to said associated amplifier stage to compensate for the distortion shifts of the associated amplifier, wherein said gain modifying means includes means for splitting an inputted signal into two components, fixed attenuator means for operating upon a first one of said components, voltage-dependant attenuator means for operating upon the second one of said components, and means for combining the two operated-upon components.

20. An amplifier circuit for amplifying a signal, said amplifier circuit comprising:

a plurality of amplifier stages in series along an amplifier path, each of said amplifier stages having an amplifier which subjects an inputted signal to distortion shifts away from their intended values; and a plurality of pre-corrector means, each of said pre-corrector means being associated with, and in series with, one of said amplifier stages and for pre-distorting the signal input to said associated amplifier stage to compensate for the distortion shifts of the associated amplifier, wherein said phase modifying means includes means for splitting an inputted signal into two components which are 90 degrees out of phase, fixed attenuator means for operating upon a first one of said components, voltage-dependant attenuator means for operating upon the second one of said components, and means for combining the two operated-upon components.

21. An amplifier circuit as set forth in claim 20, wherein said amplifier circuit is part of a broadcast signal system.

22. A method for providing an amplified, corrected signal from an amplifier circuit, the amplifier circuit having an amplifier path and including a signal source, an intermediate amplifier stage, and a power amplifier stage connected sequentially, in series along said amplifier path, the power amplifier stage includes a plurality of amplifiers operationally connected in parallel, each of said amplifiers subjecting an inputted signal to shifts away from their intended values, said method comprising:

providing a plurality of correction means;

connecting each of the correction means to be associated with one of said plurality of amplifiers and to be connected between an output of said intermediate amplifier stage and said associated amplifier;

pre-distorting the signal from the intermediate amplifier and input to the associated amplifier at each of the correction means to compensate for the distortion caused by said associated amplifier; and providing response group delay correction to the signal to enhance performance of at least one of the pre-corrector means.

23. A method for providing a corrected, amplified signal, said method comprising:

providing a plurality of amplifier stages in series along an amplifier path, each of the amplifier stages having an amplifier which subjects an inputted signal to distortion shifts away from their intended values;

providing a plurality of pre-corrector means, each of said pre-corrector means being associated with, and in series with, one of the amplifier stages;

pre-distorting the signal input to the associated amplifier stage at the pre-corrector means to compensate for the distortion shifts of the associated amplifier; and providing response group delay correction to the signal to enhance performance of at least one of the pre-corrector means.

* * * * *